United States Patent
Kaji et al.

(10) Patent No.: US 11,201,216 B2
(45) Date of Patent: Dec. 14, 2021

(54) SILICON CARBIDE SEMICONDUCTOR DEVICE AND MANUFACTURING METHOD OF SILICON CARBIDE SEMICONDUCTOR DEVICE

(71) Applicant: DENSO CORPORATION, Kariya (JP)

(72) Inventors: Aiko Kaji, Kariya (JP); Yuichi Takeuchi, Kariya (JP); Shuhei Mitani, Kariya (JP); Ryota Suzuki, Toyota (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/802,754

(22) Filed: Feb. 27, 2020

(65) Prior Publication Data

US 2020/0203482 A1    Jun. 25, 2020

Related U.S. Application Data

(63) Continuation of application No. PCT/JP2018/032005, filed on Aug. 29, 2018.

(30) Foreign Application Priority Data

Aug. 31, 2017    (JP) .............. JP2017-166883

(51) Int. Cl.
| | |
|---|---|
| *H01L 29/06* | (2006.01) |
| *H01L 29/10* | (2006.01) |
| *H01L 29/08* | (2006.01) |
| *H01L 29/16* | (2006.01) |
| *H01L 29/66* | (2006.01) |

(Continued)

(52) U.S. Cl.
CPC ...... *H01L 29/1095* (2013.01); *H01L 29/0684* (2013.01); *H01L 29/086* (2013.01); *H01L 29/1608* (2013.01); *H01L 29/66068* (2013.01); *H01L 29/7397* (2013.01); *H01L 29/7813* (2013.01); *H01L 21/046* (2013.01)

(58) Field of Classification Search
CPC combination set(s) only.
See application file for complete search history.

(56) References Cited

U.S. PATENT DOCUMENTS

| | | |
|---|---|---|
| 9,123,800 B2 | 9/2015 | Chun et al. |
| 2007/0007588 A1 | 1/2007 | Ishida et al. |

(Continued)

FOREIGN PATENT DOCUMENTS

JP    2014-239146 A    12/2014

*Primary Examiner* — Moin M Rahman
(74) *Attorney, Agent, or Firm* — Posz Law Group, PLC

(57) ABSTRACT

A silicon carbide semiconductor device includes a substrate, a drift layer disposed above the substrate, a base region disposed above the drift layer, a source region disposed above the base region, a gate trench formed deeper than the base region from a surface of the source region, a gate insulating film covering an inner wall surface of the gate trench, a gate electrode disposed on the gate insulating film, an interlayer insulating film covering the gate electrode and the gate insulating film and having a contact hole, a source electrode brought in ohmic contact with the source region through the contact hole, and a drain electrode disposed to a rear surface of the substrate. The source region has a lower impurity concentration on a side close to the base region than on a surface side brought in ohmic contact with the source region.

6 Claims, 11 Drawing Sheets

(51) Int. Cl.
*H01L 29/739* (2006.01)
*H01L 29/78* (2006.01)
*H01L 21/04* (2006.01)

(56) References Cited

U.S. PATENT DOCUMENTS

| | | |
|---|---|---|
| 2010/0006861 A1 | 1/2010 | Yamamoto et al. |
| 2011/0018005 A1 | 1/2011 | Nakano |
| 2013/0277688 A1 | 10/2013 | Nakano |
| 2015/0115286 A1* | 4/2015 | Takeuchi ............ H01L 21/8213 257/77 |
| 2016/0172471 A1* | 6/2016 | Hirabayashi ........ H01L 29/1095 257/124 |
| 2017/0229535 A1 | 8/2017 | Hatta et al. |

* cited by examiner

SILICON CARBIDE SEMICONDUCTOR DEVICE AND MANUFACTURING METHOD OF SILICON CARBIDE SEMICONDUCTOR DEVICE

CROSS REFERENCE TO RELATED APPLICATIONS

The present application is a continuation application of International Patent Application No. PCT/JP2018/032005 filed on Aug. 29, 2018, which designated the U.S. and claims the benefit of priority from Japanese Patent Application No. 2017-166883 filed on Aug. 31, 2017. The entire disclosures of all of the above applications are incorporated herein by reference.

TECHNICAL FIELD

The present disclosure relates to a silicon carbide (SiC) semiconductor device and a manufacturing method of a SiC semiconductor device.

BACKGROUND

Conventionally, there has been a SiC semiconductor device having a trench gate structure as a structure in which a channel density is increased so as to allow a large current to flow.

SUMMARY

According to one aspect of the present disclosure, a SiC semiconductor device includes a substrate, a drift layer disposed above the substrate, a base region disposed above the drift layer, a source region disposed above the base region, a gate trench formed deeper than the base region from a surface of the source region, a gate insulating film covering an inner wall surface of the gate trench, a gate electrode disposed on the gate insulating film, an interlayer insulating film covering the gate electrode and the gate insulating film and having a contact hole, a source electrode being in ohmic contact with the source region through the contact hole, and a drain electrode disposed to a rear surface of the substrate. The source region has a lower impurity concentration on a side close to the base region than on a surface side being in ohmic contact with the source region. The silicon carbide semiconductor device may further include a non-doped layer having a carrier concentration of $5.0 \times 10^{15}$ cm$^{-3}$ or less, and provided between the base region and the source region.

According to another aspect of the present disclosure, a manufacturing method of a SiC semiconductor device includes preparing a substrate, forming a drift layer above the substrate, forming a base region above the drift layer, forming a source region made above the base region, providing a gate trench deeper than the base region from a surface of the source region, forming a gate insulating film on an inner wall surface of the gate trench, forming a gate electrode on the gate insulating film, forming a source electrode electrically connected to the source region, and forming a drain electrode to a rear surface of the substrate. The forming the source region includes forming a first source region and a second source region, which is brought in contact with the source electrode, by epitaxial growth in a stated order from a side close to the base region, and the first source region is formed with an impurity concentration lower than an impurity concentration of the second source region.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
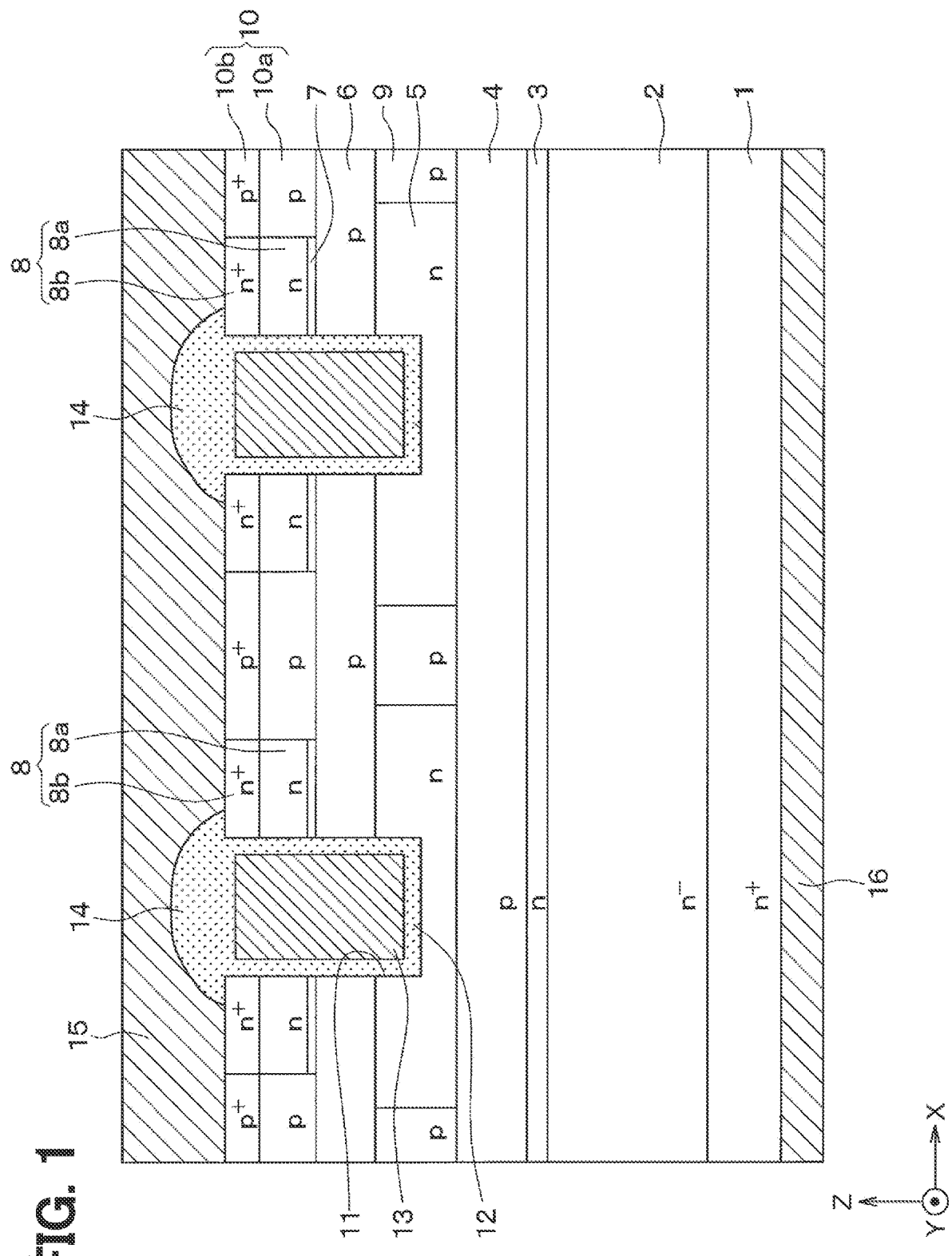
FIG. 1 is a cross-sectional view of a SiC semiconductor device according to a first embodiment.

As an example, a SiC semiconductor device may have a structure in which a p-type base region and an n$^+$-type source region are formed in order above an n-type drift layer, and a trench gate is provided so as to penetrate through the p-type base region from a surface of the n+-type source region and reach the n+-type drift layer. Specifically, the p-type base region is epitaxially grown on the n-type drift layer, and then an n-type impurity is implanted into the p-type base region by ion implantation to invert a part of the p-type base region into an n-type, thereby forming the n+-type source region.

However, in a case where an entire n+-type source region is formed of a high-concentration n-type impurity layer, a saturation current value at a time of load short circuit becomes large, and a short-circuit withstand capability of the SiC semiconductor device becomes low.

According to one aspect of the present disclosure, a SiC semiconductor device including an inverted semiconductor element includes a substrate, a drift layer, a base region, a source region, a plurality of trench gate structures, an interlayer insulating film, a source electrode, and a drain electrode. The substrate is made of silicon carbide of a first or second conductivity type. The drift layer is disposed above the substrate, is made of silicon carbide of the first conductivity type, and has an impurity concentration lower than an impurity concentration of the substrate. The base region is disposed above the drift layer, and is made of silicon carbide of the second conductivity type. The source region is disposed above the base region, is made of silicon carbide of the first conductivity type, and has an impurity concentration higher than the impurity concentration of the drift layer. The trench gate structures are aligned in stripes with one direction as a longitudinal direction. Each of the trench gate structures includes a gate trench formed deeper than the base region from a surface of the source region, a gate insulating film covering an inner wall surface of the gate trench, and a gate electrode disposed on the gate insulating film. The interlayer insulating film covers the gate electrode and the gate insulating film and has a contact hole. The source electrode is in ohmic contact with the source region through the contact hole. The drain electrode is disposed to a rear surface of the substrate. The source region has a lower impurity concentration on a side close to the base region than on a surface side being in ohmic contact with the source region.

According to another aspect of the present disclosure, in a manufacturing method of a SiC semiconductor device including an inverted semiconductor element, a substrate made of silicon carbide of a first or second conductivity type is prepared, a drift layer made of silicon carbide of the first conductivity type and having an impurity concentration lower than an impurity concentration of the substrate is formed above the substrate, a base region made of silicon carbide of the second conductivity type is formed above the drift layer, a source region made of silicon carbide of the first conductivity type and having an impurity concentration higher than the impurity concentration of the drift layer is formed above the base region, a trench gate structure is formed by providing, from a surface of the source region, a plurality of gate trenches deeper than the base region and aligned in stripes with one direction as a longitudinal direction, forming a gate insulating film on inner wall surfaces of the gate trenches, and forming a gate electrode on the gate insulating film, a source electrode electrically connected to the source region is formed, and a drain electrode is formed to a rear surface of the substrate. The base region and the source region are formed by epitaxial growth. The forming the source region includes forming a first source region and a second source region, which is brought in contact with the source electrode, by epitaxial growth in a stated order from a side close to the base region, and the first source region is formed with an impurity concentration lower than an impurity concentration of the second source region.

According to the above-described aspects, the source region has a lower impurity concentration on the side close to the base region than on the surface side brought in ohmic contact with the source region. When the low concentration region is provided on the side of the source region close to the base region in this way, a saturation current value at a time of load short circuit can be reduced, and a short-circuit withstand capability of the SiC semiconductor device can be improved.

Embodiments of the present disclosure will be described below with reference to the drawings. In the following embodiments, the same reference numerals are assigned to parts that are the same or equivalent to each other to explain the same.

First Embodiment

Figure 2:
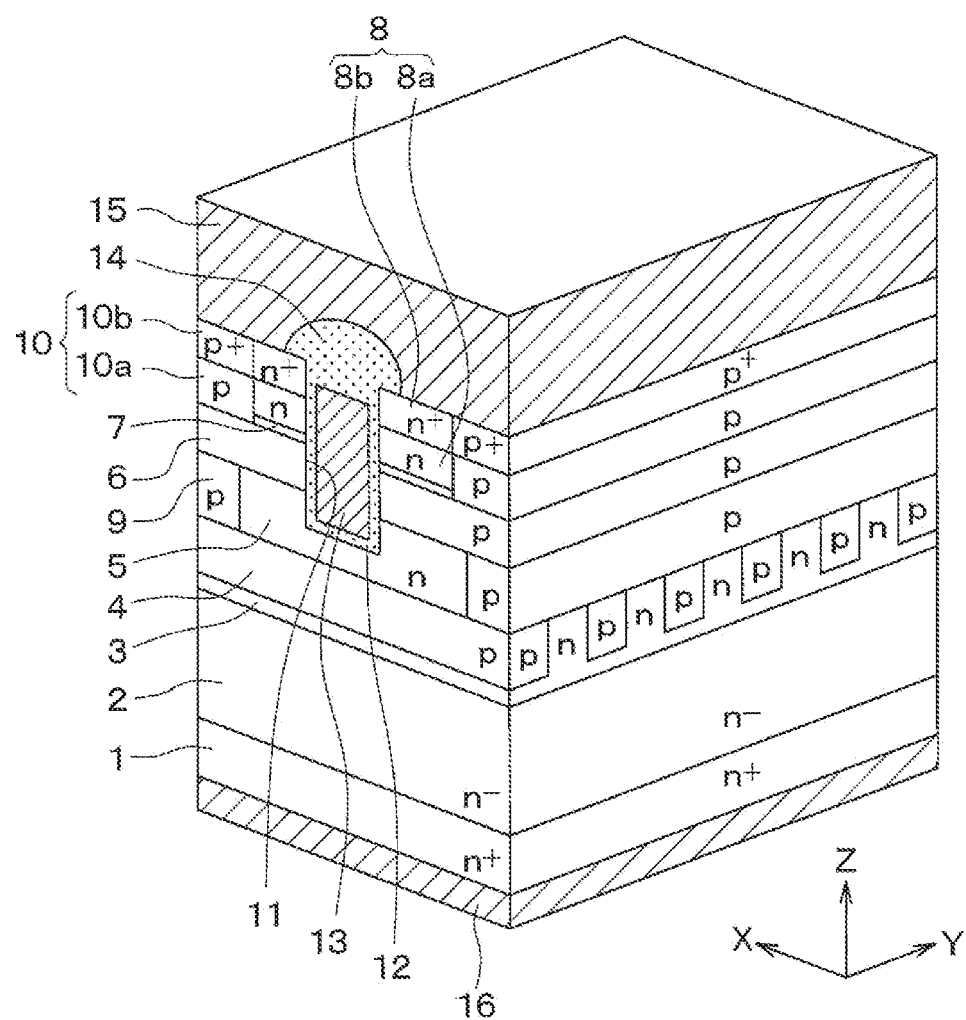
FIG. 2 is a perspective cross-sectional view of the SiC semiconductor device shown in FIG. 1.

A first embodiment will be described. In a SiC semiconductor device according to the present embodiment, an inverted vertical MOSFET having a trench gate structure shown in FIGS. 1 and 2 is formed as a semiconductor device. The vertical MOSFET shown in those figures is formed in a cell region of the SiC semiconductor device, and the SiC semiconductor device is configured by forming an outer peripheral high breakdown voltage structures so as to surround the cell region, but only the vertical MOSFET is shown in the figures. In the following description, as shown in FIGS. 1 and 2, a width direction of the vertical MOSFET is taken as an X-direction, a depth direction of the vertical MOSFET crossing the X-direction is taken as a Y-direction, a thickness direction or depth direction of the vertical MOSFET, that is, a normal direction to an XY-plane is taken as a Z-direction.

As shown in FIGS. 1 and 2, an n+-type substrate 1 made of SiC is used as a semiconductor substrate in a SiC semiconductor device. An n−-type layer 2 made of SiC is formed on a main surface of the n+-type substrate 1. The surface of the n+-type substrate 1 is a (0001) Si surface, an n-type impurity concentration of the substrate 1 is, for example, $5.9 \times 10^{18}$ cm$^{-3}$, and a thickness of the substrate 1 is 100 μm. The n−-type layer 2 has an n-type impurity concentration of, for example, $7.0 \times 10^{15}$ to $1.0 \times 10^{16}$ cm$^{-3}$ and a thickness of 8.0 μm.

A JFET portion 3 made of SiC and an electric field blocking layer 4 are formed above the n− type layer 2, and the n−-type layer 2 is connected to the JFET portion 3 at a position away from the n+-type substrate 1.

The JFET portion 3 and the electric field blocking layer 4 configure a saturation current limiting layer, and are both extended in the X-direction and alternately and repeatedly aligned in the Y-direction. In other words, at least a part of the JFET portion 3 and the electric field blocking layer 4 are shaped in multiple rectangles, that is, stripes, as viewed from a normal direction to the main surface of the n+-type substrate 1, and are alternately arranged.

In the present embodiment, the JFET portion 3 is formed below the electric field blocking layer 4. For that reason, the stripe-shaped portions of the JFET portion 3 are connected to each other below the electric field blocking layer 4, but each of the stripe-shaped portions is arranged between the multiple pieces of the electric field blocking layer 4.

The stripe-shaped portions of the JFET portion 3, that is, the rectangular portions each have a width of, for example, 0.25 µm and a pitch as a formation interval of, for example, 0.6 to 2.0 µm. A thickness of the JFET portion 3 is set to, for example, 1.5 µm, and an n-type impurity concentration of the JFET portion 3 is set to be higher than that of the n⁻-type layer 2, and is set to, for example, $5.0 \times 10^{17}$ to $2.0 \times 10^{18}$ cm⁻³.

The electric field blocking layer 4 is formed of a p-type impurity layer. As described above, the electric field blocking layer 4 has a stripe shape, and each strip-shaped portion of the electric field blocking layer 4 having a stripe shape has a width of, for example, 0.15 µm and a thickness of, for example, 1.4 µm. The electric field blocking layers 4 has a p-type impurity concentration of, for example, $3.0 \times 10^{17}$ to $1.0 \times 10^{18}$ cm⁻³. In the present embodiment, the electric field blocking layer 4 has a constant p-type impurity concentration in the depth direction. A surface of the electric field blocking layer 4 at a side opposite to the n⁻-type layer 2 is flush with a surface of the JFET portion 3.

Further, an n-type current dispersion layer 5 made of SiC is formed on the JFET portion 3 and the electric field blocking layer 4. The n-type current dispersion layer 5 is a layer that allows a current flowing through a channel to spread in the X-direction, as will be described later, and has, for example, a higher n-type impurity concentration than the n⁻-type layer 2. In the present embodiment, the n-type current dispersion layer 5 extends in the Y-direction, and has the n-type impurity concentration which is the same as or higher than that of the JFET portion 3, and a thickness of, for example, 0.5 µm.

In this example, the drift layer is described as being divided into the n⁻-type layer 2, the JFET portion 3, and the n-type current dispersion layer 5 for the sake of convenience, but those components are portions which configure the drift layer and are connected to each other.

A p-type base region 6 made of SiC is formed on the n-type current dispersion layer 5. A non-doped layer 7 made of SiC is formed on the p-type base region 6, and an n-type source region 8 is formed on the non-doped layer 7. The n-type source region 8 is formed on a portion of the p-type base region 6 corresponding to the n-type current dispersion layer 5.

The p-type base region 6 has a thickness smaller than the thickness of the electric field blocking layer 4 and a p-type impurity concentration lower than the p-type impurity concentration of the electric field blocking layer 4. For example, the p-type base region 6 has a p-type impurity concentration of $3 \times 10^{17}$ cm⁻³ and a thickness of 0.4 to 0.6 µm.

The non-doped layer 7 is a layer which is not doped with an impurity or a layer in which a carrier concentration is lowered by doping both an n-type impurity and a p-type impurity. A thickness of the non-doped layer 7 is set to 0.05 to 0.2 µm. It is preferable that neither of an n-type impurity nor a p-type impurity is doped in the non-doped layer 7, but even if the non-doped layer 7 is doped, a carrier concentration of the non-doped layer 7 may be set to $5.0 \times 10^{15}$ cm⁻³ or less. For example, in the non-doped layer 7, an n-type impurity such as nitrogen (N) is set to $1.0 \times 10^{16}$ cm⁻³ or less, preferably $1.0 \times 10^{15}$ cm⁻³ or less. In the non-doped layer 7, a p-type impurity such as aluminum (Al) is set to $1.0 \times 10^{16}$ cm⁻³ or less, preferably $1.0 \times 10^{15}$ cm⁻³ or less. When only one of the p-type impurity and the n-type impurity is doped, the impurity concentration is set to $5.0 \times 10^{15}$ cm⁻³ or less, and when both the p-type impurity and the n-type impurity are doped, the carrier concentration is set to $5.0 \times 10^{15}$ cm⁻³ or less by mutually canceling each other.

The n-type source region 8 has a structure in which the n-type impurity concentration is differ between one side close to the non-doped layer 7 and the p-type base region 6 and the other side close to a front surface, that is, a front surface side. More specifically, the n-type source region 8 has a first source region 8a disposed close to the non-doped layer 7 and the p-type base region 6, and a second source region 8b disposed close to the front surface.

The first source region 8a has an n-type impurity concentration lower than an n-type impurity concentration of the second source region 8b, and is in contact with the non-doped layer 7 in the present embodiment. The first source region 8a has an n-type impurity concentration of, for example, $2.0 \times 10^{16}$ to $1.0 \times 10^{17}$ cm⁻³ or less, and a thickness of 0.2 to 0.5 µm, preferably 0.3 µm or more.

The second source region 8b is a region for bringing in contact with a source electrode 15, which will be described later, and has a high concentration of n-type impurity. The second source region 8b has an n-type impurity concentration of, for example, $1.0 \times 10^{18}$ to $5.0 \times 10^{19}$ cm⁻³ and a thickness of 0.1 to 0.2 µm.

In addition, a p-type deep layer 9 is formed downward from the p-type base region 6, specifically, between the surfaces of the JFET portion 3 and the electric field blocking layer 4 and the p-type base region 6, in a portion where the n-type current dispersion layer 5 is not formed. In the present embodiment, the p-type deep layer 9 is formed in a strip shape in a direction intersecting with the stripe-shaped portions of the JFET portion 3 and a longitudinal direction of the electric field blocking layer 4, in this example, with the Y-direction as a longitudinal direction, and is laid out in a stripe shape by aligning the multiple p-type deep layers 9 in the X-direction. The p-type base region 6 and the electric field blocking layer 4 are electrically connected to each other through the p-type deep layer 9. A formation pitch of the p-type deep layer 9 is matched with a cell pitch serving as a formation interval of trench gate structures to be described later, and the p-type deep layer 9 is disposed between the adjacent trench gate structures.

Further, a p-type coupling layer 10 is formed on the p-type base region 6 at a position corresponding to the p-type deep layer 9, that is, at a position different from that of the n-type source region 8 and on the opposite side of the trench gate structure across the n-type source region 8. The p-type coupling layer 10 is a layer for electrically connecting the p-type base region 6 to the source electrode 15 to be described later. In the present embodiment, the p-type coupling layer 10 has a structure in which the p-type impurity concentration is different between one side close to the p-type base region 6 and the other side close to the front surface. Specifically, the p-type coupling layer 10 is configured to have a first region 10a disposed close to the p-type base region 6 and a second region 10b disposed close to the front surface.

The first region 10a is configured to be substantially the same as or deeper than the first source region 8a, has a p-type impurity concentration lower than a p-type impurity concentration of the second region 10b, and is in contact with the p-type base region 6. The first region 10a has a p-type impurity concentration of, for example, $2.0 \times 10^{17}$ to $1.0 \times 10^{19}$ cm⁻³ and a thickness of 0.2 to 0.5 µm, preferably 0.3 µm or more. However, in the present embodiment, since the first region 10a is formed by ion implantation into the first source region 8a, the carrier concentration, that is, the p-type impurity concentration for functioning as a carrier is set to $2.0 \times 10^{17}$ to $1.0 \times 10^{19}$ cm⁻³.

The second region 10b has the same depth as that of the second source region 8b, and is a region for bringing in contact with the source electrode 15, which will be described later, and has a high p-type impurity concentration. The second region 10b has, for example, a p-type impurity concentration of $2.0 \times 10^{18}$ to $1.0 \times 10^{20}$ cm$^{-3}$ and a thickness of 0.2 to 0.3 μm. However, in the present embodiment, since the second region 10b is formed by ion implantation into the second source region 8b, the carrier concentration, that is, the p-type impurity concentration for functioning as a carrier is set to $2.0 \times 10^{18}$ to $1.0 \times 10^{20}$ cm$^{-3}$.

As will be described later, in the present embodiment, the p-type coupling layer 10 is formed by ion implantation of the p-type impurity into the n-type source region 8. In this case, the p-type impurity concentration of the first region 10a and the second region 10b means the concentration of the p-type impurity which functions as a carrier. Some of the p-type impurity is canceled with the n-type impurity contained in the first source region 8a prior to implantation, and does not function as a carrier. For that reason, when the p-type coupling layer 10 is formed by ion implantation, the p-type impurity concentration described above can be obtained by implanting the p-type impurity at a dose amount of, for example, 2 to 10 times the n-type impurity concentration in the first source region 8a or the second source region 8b in consideration of an activation rate.

Further, a gate trench 11 having a width of, for example, 0.4 μm and a depth of 0.2 to 0.4 μm deeper than the total film thickness of the p-type base region 6 and the n-type source region 8 is formed so as to penetrate through the n-type source region 8 and the p-type base region 6 and reach the n-type current dispersion layer 5. The p-type base region 6, the non-doped layer 7, and the n-type source region 8 are disposed so as to be in contact with the side surface of the gate trench 11. The gate trench 11 is formed in a strip-shaped layout in which the X-direction in FIG. 2 is defined as a width direction, the direction intersecting with the longitudinal direction of the JFET portion 3 and the electric field blocking layer 4, in this case, the Y-direction is defined as a longitudinal direction, and the Z-direction is defined as a depth direction. As shown in FIG. 1, multiple gate trenches 11 are formed in a stripe shape disposed at regular intervals in the X-direction, and the p-type base region 6, the non-doped layer 7, and the n-type source region 8 are disposed between the respective gate trenches 11. In addition, the p-type deep layer 9 and the p-type coupling layer 10 are disposed at intermediate positions of the gate trenches 11.

At the position of the side surface of the gate trench 11, the p-type base region 6 and the non-doped layer 7 form a channel region connecting the n-type source region 8 and the n-type current dispersion layer 5 when the vertical MOSFET is operated. An inner wall surface of the gate trench 11 including the channel region is covered with a gate insulating film 12. A gate electrode 13 made of doped Poly-Si is formed on a surface of the gate insulating film 12, and the gate trench 11 is filled with the gate insulating film 12 and the gate electrode 13 to form a trench gate structure.

The source electrode 15, a gate wire layer (not shown), and the like are formed on the surface of the n-type source region 8 and the surface of the gate electrode 13 across an interlayer insulating film 14. The source electrode 15 and the gate wire layer are made of multiple metals, for example, Ni/Al. At least a portion of the multiple metals which is in contact with the n-type SiC, specifically, the n-type source region 8 is made of a metal capable of bringing in ohmic contact with the n-type SiC. In addition, at least a portion of the multiple metals which is in contact with the p-type SiC, specifically, the second region 10b is made of a metal capable of bringing in ohmic contact with the p-type SiC. The source electrode 15 is electrically insulated from the SiC portion by being formed on the interlayer insulating film 14, but comes in electric contact with the n-type source region 8 and the p-type deep layer 9 through a contact hole provided in the interlayer insulating film 14.

On the other hand, a drain electrode 16 electrically connected to the n$^+$-type substrate 1 is formed on a rear surface of the n$^+$-type substrate 1. Such a structure configures a vertical MOSFET of an n-channel type inverted trench gate structure. A cell region is formed by placing the vertical MOSFET cells described above. The SiC semiconductor device is configured by providing an outer peripheral high breakdown voltage structure by a guard ring (not shown) or the like so as to surround a cell region in which such a vertical MOSFET is formed.

The SiC semiconductor device having the vertical MOSFET configured as described above is operated by applying a gate voltage Vg of 20 V to the gate electrode 13 while a source voltage Vs is set to 0 V and a drain voltage Vd is set to 1 to 1.5 V, for example. In other words, the vertical MOSFET forms channel regions in the p-type base region 6 and the non-doped layer 7 in a portion which comes in contact with the gate trench 11 by applying the gate voltage Vg. As a result, the n-type source region 8 and the n-type current dispersion layer 5 are electrically connected to each other. Therefore, the vertical MOSFET performs the operation of allowing a current to flow between the drain and the source from the n$^+$-type substrate 1 through the drift layer formed of the n$^-$-type layer 2, the JFET portion 3, and the n-type current dispersion layer 5, and from the channel region through the n-type source region 8.

In addition, when the vertical MOSFET in the semiconductor device described above is applied to inverter circuits or the like in which an upper arm and a lower arm are respectively disposed, a parasitic diode incorporated in the vertical MOSFET functions as a freewheeling diode. Specifically, a parasitic diode is formed by a PN junction formed by an n-type layer forming a drift layer such as the n$^-$-type layer 2 and a p-type layer including the electric field blocking layer 4, the p-type base region 6, or the p-type deep layer 9, and the parasitic diode functions as a freewheeling diode.

The inverter circuit or the like is used when supplying an AC current to a load such as an AC motor or the like while using a DC power supply. For example, in an inverter circuit or the like, multiple bridge circuits in which an upper arm and a lower arm are connected in series to a DC power supply are connected in parallel to each other, and the upper arm and the lower arm of each bridge circuit are alternately and repeatedly turned on and off, thereby supplying an AC current to a load.

Specifically, in the respective bridge circuits such as the inverter circuits, the vertical MOSFET of the upper arm is turned on and the vertical MOSFET of the lower arm is turned off, thereby supplying a current to the load. Thereafter, the vertical MOSFET of the upper arm is turned off, and the vertical MOSFET of the lower arm is turned on to stop supplying the current. When the vertical MOSFET of the respective arms is switched on and off, the parasitic diode provided in the vertical MOSFET to be turned off functions as a freewheeling diode and performs an operation during reverse conduction in which a reflux current flows between the source and the drain. In this manner, AC driving of the load by the inverter circuit or the like is performed.

In performing such an operation, when load short-circuit occurs, a voltage of, for example, 600 to 1200 V or more is applied to the drain as a drain-source voltage Vds. At this time, if the entire n-type source region 8 is formed of an n-type impurity layer having a high concentration, a saturation current value at the time of load short-circuiting becomes large, and the short-circuit withstand capability of the SiC semiconductor device cannot be obtained. However, in the SiC semiconductor device according to the present embodiment, since the n-type source region 8 is configured by the first source region 8a having a relatively low concentration and the second source region 8b having a higher concentration, the saturation current value at the time of load short-circuiting can be reduced. This makes it possible to improve the short-circuit withstand capability of the SiC semiconductor device.

Figure 3:
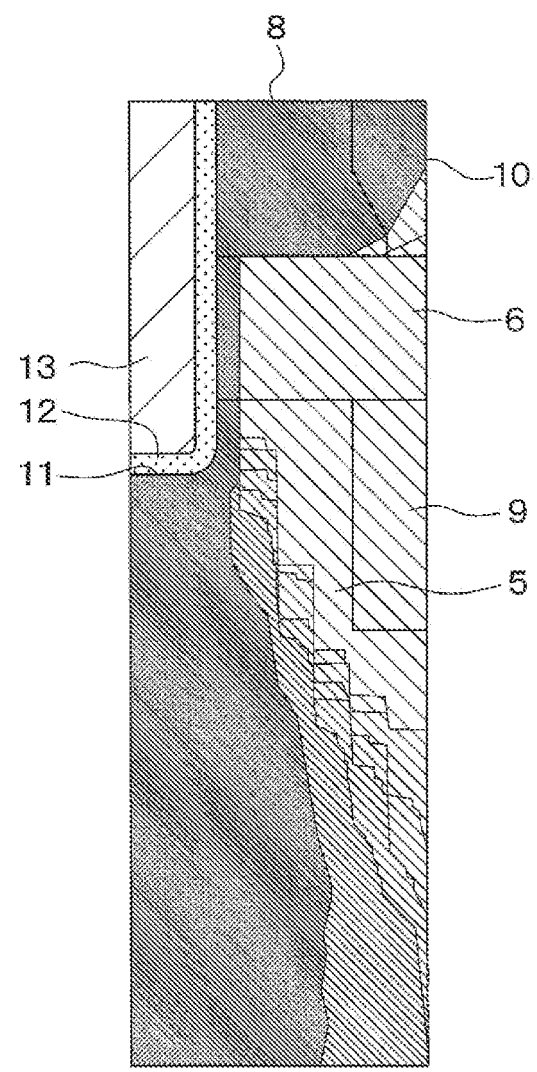
FIG. 3 is a graph showing a result of a simulation of an electron current density in a case where an entire n-type source region has a high concentration.
Figure 4:
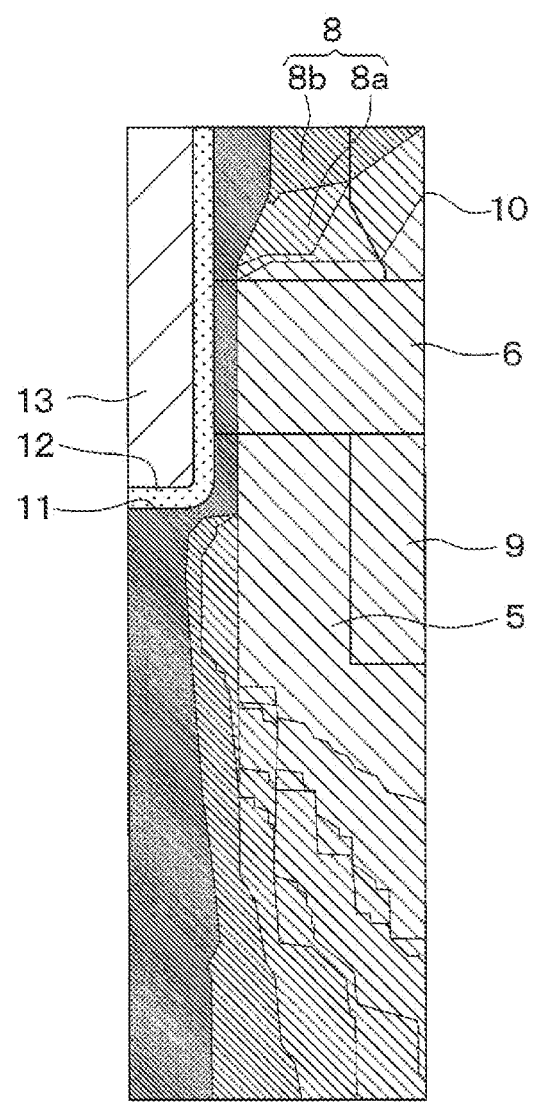
FIG. 4 is a graph showing a result of a simulation of an electron current density in a case where an n-type source region is configured by a first source region and a second source region.
Figure 5:
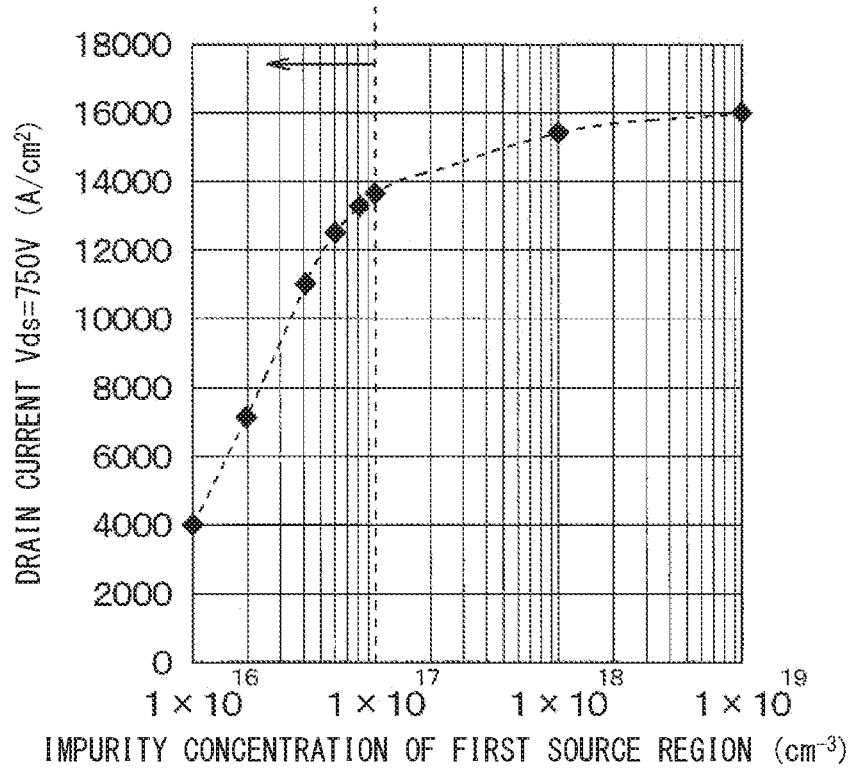
FIG. 5 is a graph showing a result of a simulation of a change of a drain current while changing an impurity concentration of the first source region.

In this example, in each of a case in which the entire n-type source region 8 is set to have a high concentration, and a case in which the entire n-type source region 8 is configured by the first source region 8a and the second source region 8b as in the present embodiment, an electron current density is examined by simulation. FIGS. 3 and 4 are diagrams showing the respective results. In the drawing, the electron current density is higher in a portion where an interval between hatching is narrower. In addition, a change in the drain current is examined by changing the impurity concentration of the first source region 8a. FIG. 5 shows the results.

In the simulations of FIGS. 3 to 5, it is assumed that the source voltage Vs is 0 V, the gate voltage Vg is 20 V, and the drain voltage Vd is 750 V. In the simulations shown in FIG. 3, the n-type impurity concentration in the entire n-type source region 8 is set to $1.0 \times 10^{19}$ cm$^{-3}$. Similarly, in the simulations of FIG. 4, while the n-type source region 8 is configured by the first source region 8a and the second source region 8b, the n-type impurity concentration of the first source region 8a is set to $1.0 \times 10^{16}$ cm$^{-3}$, and the n-type impurity concentration of the second source region 8b is set to $1.0 \times 10^{19}$ cm$^{-3}$. In the simulations of FIG. 5, while the n-type source region 8 is configured of the first source region 8a and the second source region 8b, the n-type impurity concentration of the second source region 8b is set to $1.0 \times 10^{19}$ cm$^{-3}$, and the n-type impurity concentration of the first source region 8a is changed.

As shown in FIG. 3, when the n-type impurity concentration in the entire n-type source region 8 is high, it is understood that the electron current density is high in the entire n-type source region 8. This is considered to be because, since the n-type source region 8 has the high concentration, a depletion region is hardly generated, and a current flows in the entire n-type source region 8.

On the other hand, as shown in FIG. 4, when the n-type source region 8 is formed of the first source region 8a and the second source region 8b, it is understood that the electron current density is reduced in the first source region 8a. This is considered to be because, since the first source region 8a has a low density, depletion occurs so as to enter a wide area of the first source region 8a, and a current does not flow in the depleted area.

From the simulation results, it is conceivable that the saturation current value at the time of load short-circuiting can be reduced by configuring the n-type source region 8 by the first source region 8a and the second source region 8b. Therefore, it is understood that the structure of the present embodiment makes it possible to improve the short-circuit withstand capability of the SiC semiconductor device.

Although the n-type impurity concentration of the first source region 8a may be lower than that of the second source region 8b, the saturation current value cannot be lowered to a desired value unless the concentration is at a certain level. Specifically, if the drain current at the time of load short-circuiting the load is set to be equal to or less than the 14000 A/cm$^2$, a desired short-circuit withstand capability can be obtained. As shown in FIG. 5, the drain current at the time of the load short-circuiting becomes equal to or less than 14000 A/cm$^2$ when the n-type impurity concentration of the first source region 8a becomes equal to or less than $1.0 \times 10^{17}$ cm$^{-3}$. Therefore, as in the SiC semiconductor device of the present embodiment, the n-type impurity concentration of the first source region 8a is set to $1.0 \times 10^{17}$ cm$^{-3}$ or less, thereby being capable of improving the short-circuit withstand capability.

Figure 6:
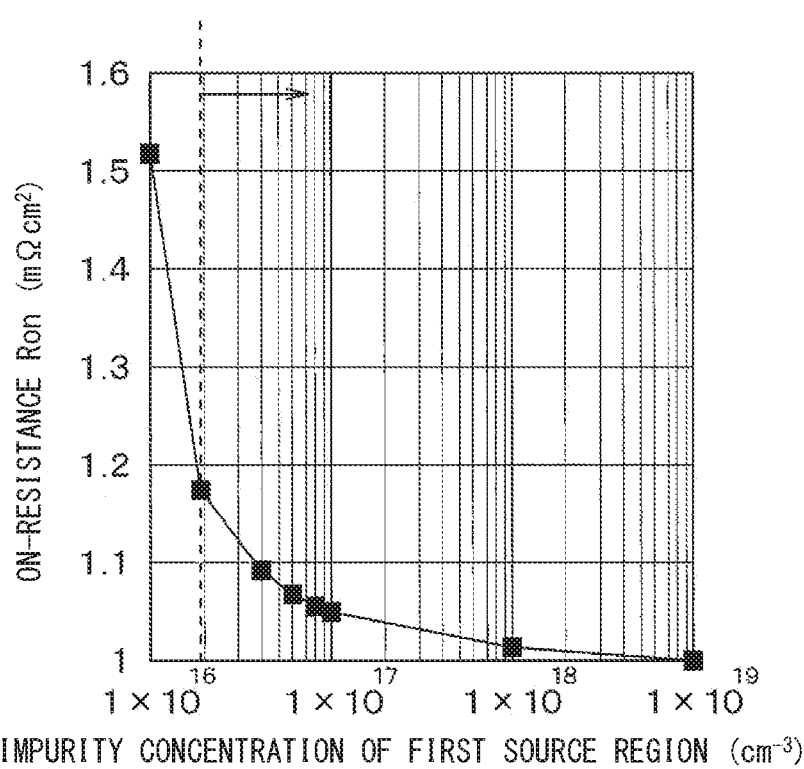
FIG. 6 is a graph showing a result of a simulation for examining a relationship between an n-type impurity concentration and an on-resistance of the first source region.

However, if the n-type impurity concentration of the first source region 8a is too low, a resistance value of the first source region 8a becomes too large, with the result that an on-resistance Ron increases. A relationship between the n-type impurity concentration and the on-resistance Ron of the first source region 8a is examined, and the result shown in FIG. 6 is obtained. In view of the high-speed switching operation of the SiC semiconductor device, the on-resistance Ron is preferably 1.2 mΩcm$^2$ or less. According to the result of FIG. 6, when the n-type impurity concentration of the first source region 8a is less than $2.0 \times 10^{16}$ cm$^{-3}$, the on-resistance Ron rapidly rises, but when the n-type impurity concentration is greater than or equal to 1.2 mΩcm$^2$ or less, the on-resistance Ron can be reduced to 1.2 mΩcm$^2$ or less. Therefore, as in the SiC semiconductor device of the present embodiment, the n-type impurity concentration of the first source region 8a is set to $2.0 \times 10^{16}$ cm$^{-3}$ or more, thereby being capable of restricting the on-resistance Ron from deteriorating.

In this manner, the n-type impurity concentration of the first source region 8a is set to $2.0 \times 10^{16}$ to $1.0 \times 10^{17}$ cm$^{-3}$, thereby being capable of restricting the on-resistance Ron from deteriorating while the short-circuit withstand capability is improved.

Figure 7:
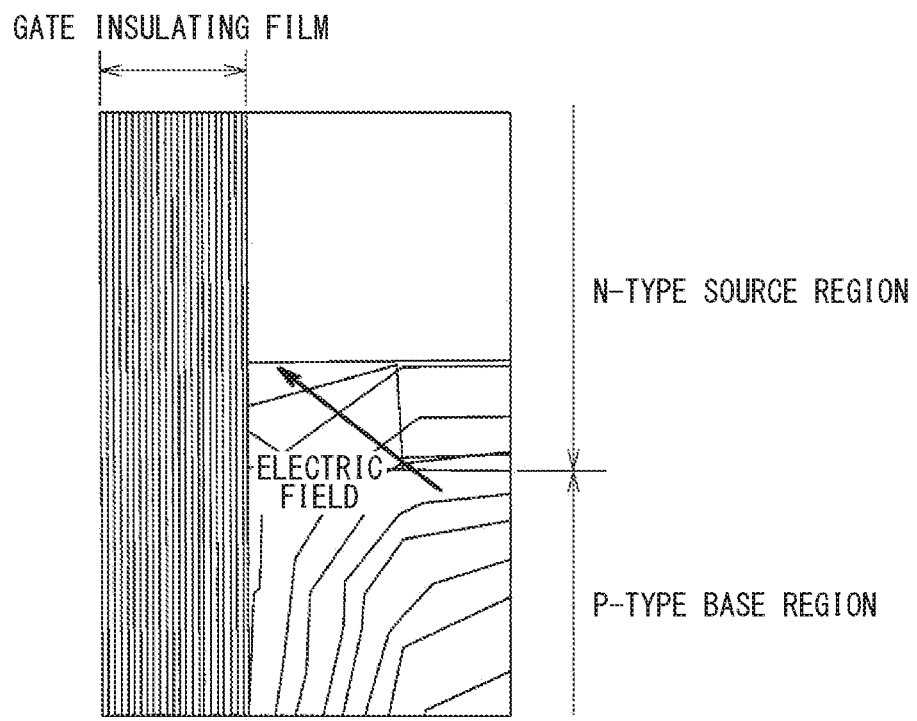
FIG. 7 is a diagram showing a result of examining a voltage distribution during reverse conduction in the case where the entire n-type source region has a high impurity concentration.
Figure 8:
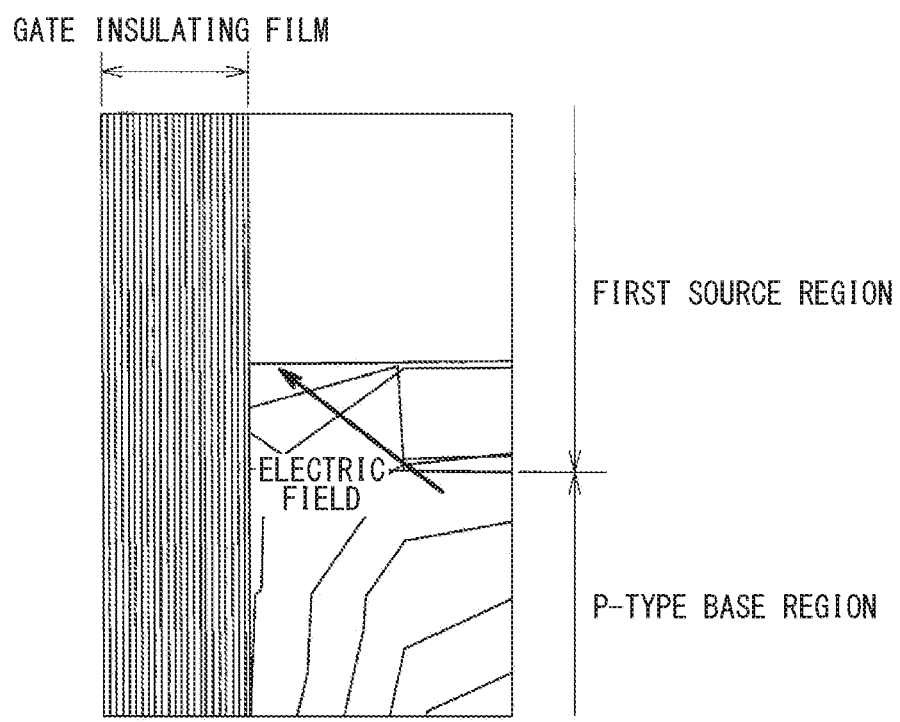
FIG. 8 is a diagram showing a result of examining a voltage distribution during reverse conduction in a case where the first source region is formed in contact with a p-type base region.
Figure 9:
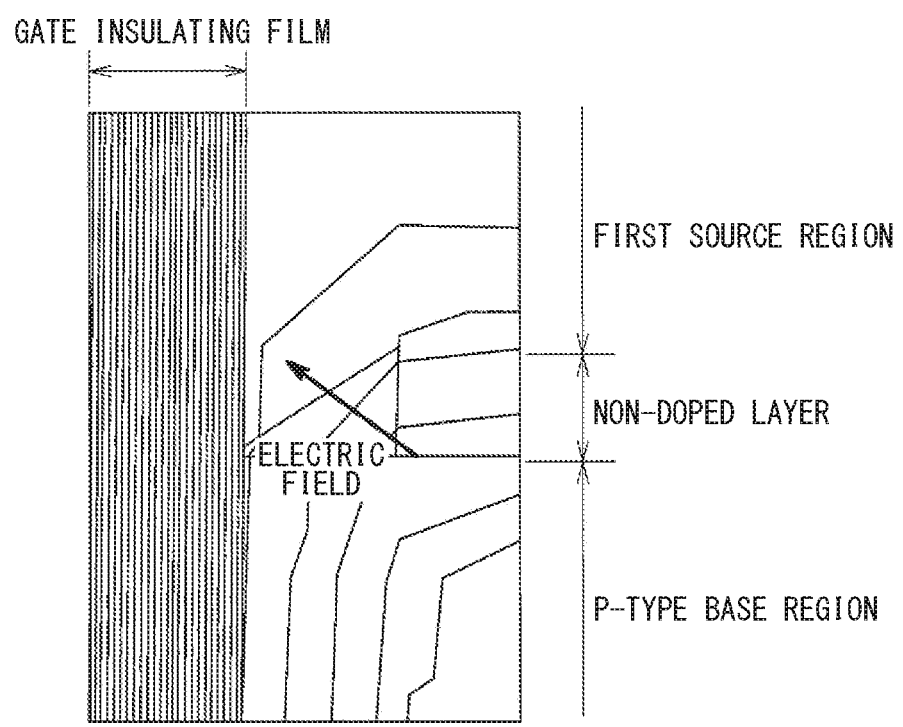
FIG. 9 is a diagram showing a result of examining a voltage distribution during t reverse conduction in a case where a non-doped layer is provided.

Further, in the SiC semiconductor device of the present embodiment, the non-doped layer 7 is provided between the p-type base region 6 and the first source region 8a. For that reason, the effect of being able to restrict the damage to the gate insulating film 12 can be obtained. This effect will be described with reference to FIGS. 7 to 9. FIGS. 7 to 9 show the results of examining the voltage distributions at the time of reverse conduction in the case where the entire n-type source region 8 has a high impurity concentration, in the case where the first source region 8a is formed so as to be in contact with the p-type base region 6, and in the case where the structure of the present embodiment is provided with the non-doped layer 7. The condition at the time of reverse conduction is that the gate voltage Vg is set to 20 V and the drain-source voltage Vds is set to −5 V.

At the time of reverse conduction, the parasitic diode formed in the vertical MOSFET basically functions as a freewheeling diode, and a reflux current flows through the parasitic diode. Holes diffused from the p-type layer side to the n-type layer side of the PN junction configuring the parasitic diode recombine with electronics in the n-type layer. At this time, since a recombination energy is high, a basal plane dislocation (hereinafter referred to as BPD) in the n-type layer formed of an epitaxial film expands, resulting in stacking faults called single Shockley stacking faults (hereinafter referred to as SSSF). Since the BPD is a linear defect, the BPD occupies a small area in the cell region in the SiC semiconductor device and has little influence on the element operation, but when the BPD becomes SSSF, the BPD occupies a large area in the cell region because of stacking faults and the BPD has a large influence on the element operation. For that reason, if the gate voltage Vg is actively applied to the gate voltage Vg even during the reverse conduction to form the channel region and the reflux current flows through the channel region, the reflux current can be dispersed and the recombination energy can be reduced, so that generation of SSSF can be restricted. However, since the flow of the reflux current through the channel region occurs, a high electric field is applied between the p-type base region 6 and the n-type source region 8, causing hot electrons and causing damage to the gate insulating film 12.

More specifically, as shown in FIG. 7, when the n-type source region 8 having a high concentration in the entire region is formed so as to be in contact with the p-type base region 6, a potential distribution is generated at the PN junction portion at the time of reverse conduction, and a high electric field is applied to the n-type source region 8. When the n-type source region 8 is formed so as to be in contact with the p-type base region 6, carriers existing in the portion of the n-type source region 8 which is in contact with the p-type base region 6 are accelerated by the electric field by an electric field applied to the n-type source region 8, and become hot electrons. A problem that the hot electrons collide with the gate insulating film 12, and damage the gate insulating film 12 occurs. In particular, when the n-type impurity concentration is increased in the entire n-type source region 8, this problem becomes conspicuous.

On the other hand, when the first source region 8a is provided in the n-type source region 8 even if the non-doped layer 7 is not provided, the p-type base region 6 and the first source region 8a configure a PN junction. As described above, when the first source region 8a is provided, even if the non-doped layer 7 is not provided, the n-type impurity concentration of the first source region 8a is relatively low, so that the electric field applied to the PN junction can be restricted to some extent. In other words, as shown in FIG. 8, a distance between equipotential lines at the PN junction portion is wider than that in FIG. 7, and the electric field can be restricted to some extent by the structure having the first source region 8a.

However, in the case where the non-doped layer 7 is not formed, the PN junction formed by the p-type base region 6 and the first source region 8a is formed, so that the above-mentioned problem can be caused by generation of the hot electrons although the electric field is reduced as compared with the case of FIG. 7.

On the other hand, when the non-doped layer 7 is provided between the p-type base region 6 and the first source region 8a as in the present embodiment, as shown in FIG. 9, equipotential lines can be received by the non-doped layer 7, and the electric field in the n-type source region 8 can be weakened. Although the electric field is generated in the non-doped layer 7, almost no carriers exist in the non-doped layer 7. Therefore, with the provision of the non-doped layer 7, the gate insulating film 12 can be restricted from being damaged due to the hot electrons at the time of reverse conduction.

Therefore, when reverse conduction is performed, the generation of hot electrons can be restricted while the generation of SSSF is restricted by actively causing the reflux current to flow not only through the parasitic diodes but also through the channel region, and the gate insulating film 12 can be restricted from being damaged.

Further, the SiC semiconductor device according to the present embodiment includes the JFET portion 3 and the electric field blocking layer 4. For that reason, during the operation of the vertical MOSFET, the JFET portion 3 and the electric field blocking layer 4 function as a saturation current control layer, and exhibit the saturation current control effect, so that a low on-resistance can be achieved and a low saturation current can be maintained. Specifically, since the stripe shaped portions of the JFET portion 3 and the electric field blocking layer 4 are alternately formed repeatedly, the following operation is performed.

First, when the drain voltage Vd is a voltage applied during normal operation, for example, 1 to 1.5 V, the depletion layer extending from the electric field blocking layer 4 to the JFET portion 3 extends only to a width smaller than the width of the stripe shaped portion of the JFET portion 3. For that reason, even if the depletion layer extends into the JFET portion 3, a current path is secured. Since the n-type impurity concentration of the JFET portion 3 is higher than the concentration of the n$^-$-type layer 2, and the current path can be configured to have a low resistance, a low on-resistance can be achieved.

When the drain voltage Vd becomes higher than the drain voltage Vd at the time of normal operation due to a load short-circuiting or the like, the depletion layer extending from the electric field blocking layer 4 to the JFET portion 3 extends more than the width of the stripe shaped portion of the JFET portion 3. Then, the JFET portion 3 is immediately pinched off prior to the n-type current dispersion layer 5. At this time, a relationship between the drain voltage Vd and the width of the depletion layer is determined based on the width of the stripe shaped portions of the JFET portion 3 and the n-type impurity concentration. For that reason, the widths and n-type impurity concentrations of the stripe shaped portions of the JFET portion 3 are set so that the JFET portion 3 is pinched off when the drain voltage Vd is slightly higher than the drain voltage Vd at the time of normal operation. As a result, the JFET portion 3 can be pinched off even at a low drain voltage Vd. In this manner, the JFET portion 3 is immediately pinched off when the drain voltage Vd becomes higher than the drain voltage Vd at the time of normal operation, so that a low saturation current can be maintained, and the tolerance of the SiC semiconductor device due to a load short-circuiting or the like can be further improved.

As described above, the JFET portion 3 and the electric field blocking layer 4 function as the saturation current control layer, and the saturation current control effect is exhibited, thereby being capable of providing the SiC semiconductor device which can further achieve both a low on-resistance and a low saturation current.

Further, with the provision of the electric field blocking layer 4 so as to sandwich the JFET portion 3, the stripe shaped portions of the JFET portion 3 and the electric field blocking layer 4 are alternately and repeatedly formed. For that reason, even if the drain voltage Vd becomes a high voltage, the extension of the depletion layer extending from the lower side to the n$^-$-type layer 2 is restricted by the electric field blocking layer 4, and the depletion layer can be prevented from extending to the trench gate structure. Therefore, an electric field control effect for lowering the electric field applied to the gate insulating film 12 can be exhibited, and the gate insulating film 12 can be restricted from being broken, so that a highly reliable element with high breakdown voltage can be obtained. In order to prevent the extension of the depletion layer into the trench gate structure as described above, the n-type impurity concentrations of the n$^-$-type layer 2 and the JFET portion 3 configuring a part of the drift layer can be made relatively high, and the on-resistance can be reduced.

Therefore, the SiC semiconductor device having a vertical MOSFET with low on-resistance and high reliability can be provided.

Next, a method of manufacturing the SiC semiconductor device including the vertical MOSFET of the n-channel type inverted trench gate structure according to the present embodiment will be described with reference to cross-sectional views of the SiC semiconductor device during a manufacturing process shown in FIGS. 10A to 10H.

Figure 10A:
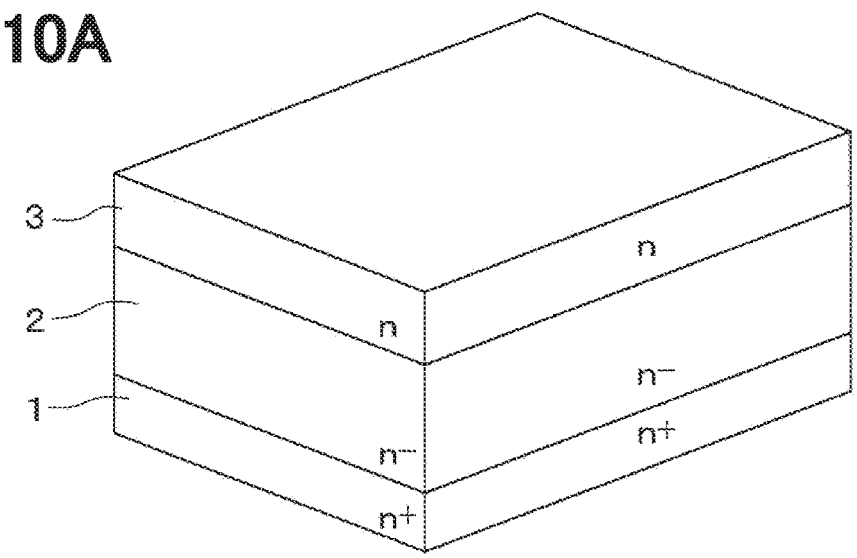
FIG. 10A is a perspective cross-sectional view showing a process of manufacturing the SiC semiconductor device shown in FIG. 1.

[Process Shown in FIG. 10A]

First, the $n^+$-type substrate 1 is prepared as a semiconductor substrate. Then, the $n^-$-type layer 2 made of SiC is formed on the main surface of the $n^+$-type substrate 1 by epitaxial growth through a CVD (Chemical Vapor Deposition) device (not shown). At this time, a so-called epitaxial substrate in which the $n^-$-type layer 2 is grown in advance on the main surface of the $n^+$-type substrate 1 may be used. Then, the JFET portion 3 made of SiC is epitaxially grown on the $n^-$-type layer 2.

The epitaxial growth is performed by introducing a gas serving as an n-type dopant, for example, nitrogen gas, in addition to silane and propane serving as raw material gases of SiC.

Figure 10B:
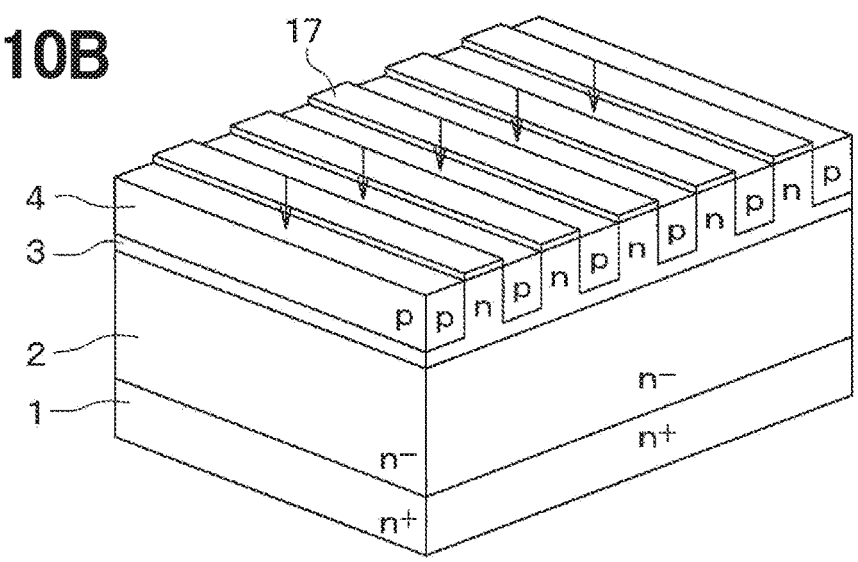
FIG. 10B is a perspective cross-sectional view showing a process of manufacturing the SiC semiconductor device subsequent to FIG. 10A.

[Process Shown in FIG. 10B]

After a mask 17 is disposed on a surface of the JFET portion 3, the mask 17 is patterned to open a region where the electric field blocking layer 4 is to be formed. Then, the p-type impurity is ion-implanted to form the electric field blocking layer 4. Thereafter, the mask 17 is removed.

Although the electric field blocking layer 4 is formed by ion implantation in this example, the electric field blocking layer 4 may be formed by a method other than ion implantation. For example, the JFET portion 3 is selectively anisotropically etched to form a recess portion at a position corresponding to the electric field blocking layer 4, a p-type impurity layer is epitaxially grown on the concave portion, and then the p-type impurity layer is flattened at a portion located on the JFET portion 3 to form the electric field blocking layer 4. In this manner, the electric field blocking layer 4 can also be formed by epitaxial growth. When the p-type SiC is epitaxially grown, a gas to be a p-type dopant, for example, trimethylaluminum (hereinafter referred to as TMA) may be introduced in addition to the source gas of SiC.

Figure 10C:
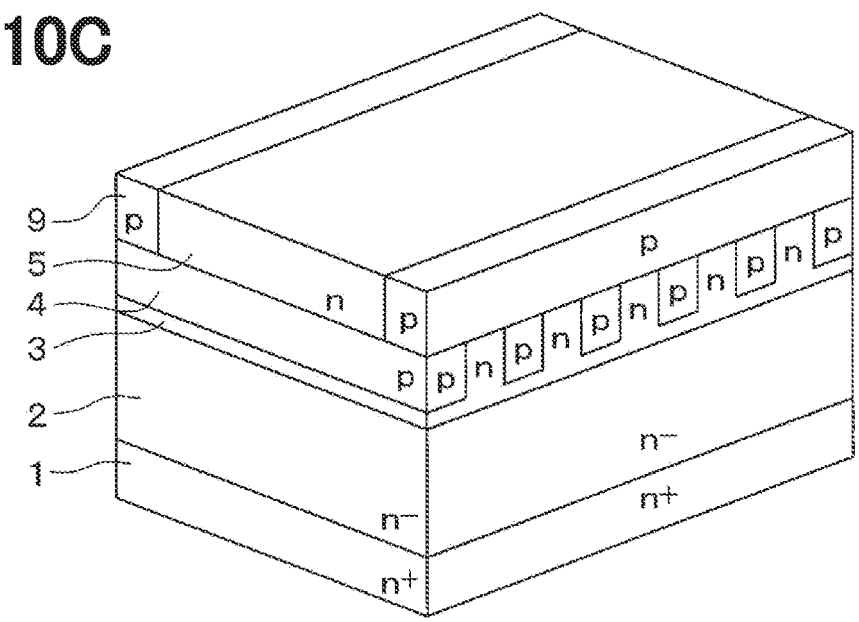
FIG. 10C is a perspective cross-sectional view showing a process of manufacturing the SiC semiconductor device subsequent to FIG. 10B.

[Process Shown in FIG. 10C]

Subsequently, n-type SiC is epitaxially grown on the JFET portion 3 and the electric field blocking layer 4 to form the n-type current dispersion layer 5. A mask (not shown) in which a region where the p-type deep layer 9 is to be formed is opened is disposed on the n-type current dispersion layer 5. Thereafter, the p-type deep layer 9 is formed by ion implantation of p-type impurities from above the mask. Although an example in which the p-type deep layer 9 is formed by ion implantation has been described, the p-type deep layer 9 can also be formed by a method other than ion implantation. For example, similarly to the electric field blocking layer 4, the p-type deep layer 9 may be formed by forming a recess portion in the n-type current dispersion layer 5, then epitaxially growing the p-type impurity layer, and flattening the p-type impurity layer.

Figure 10D:
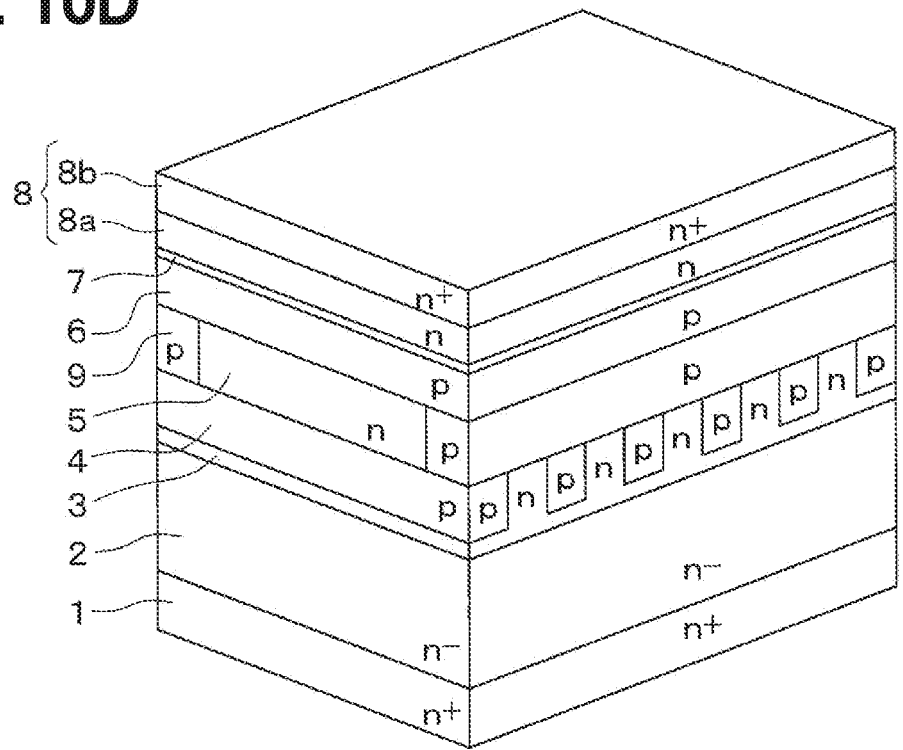
FIG. 10D is a perspective cross-sectional view showing a process of manufacturing the SiC semiconductor device subsequent to FIG. 10C.

[Process Shown in FIG. 10D]

The p-type base region 6, the non-doped layer 7, and the n-type source region 8 are epitaxially grown in a stated order on the n-type current dispersion layer 5 and the p-type deep layer 9 with the use of a CVD device (not shown). For example, in the same CVD device, first, the p-type deep layer 9 is formed by epitaxial growth in which a gas to be a p-type dopant is introduced. Subsequently, the non-doped layer 7 is formed by successively performing epitaxial growth in a state in which the introduction of dopant gases of both the p-type dopant and the n-type dopant is stopped. When the film thickness of the non-doped layer 7 reaches a predetermined film thickness, an n-type source region 8 is formed by epitaxial growth in which a gas to be an n-type dopant is introduced. At this time, the n-type impurity concentrations of the first source region 8a and the second source region 8b are adjusted to desired values by adjusting the introduction amount of the n-type dopant.

In this manner, the p-type base region 6, the non-doped layer 7, and the n-type source region 8 can be formed with the impurity concentrations and film thicknesses described above. In this example, the film thickness and the impurity concentration of each portion are determined as follows.

First, since the p-type base region 6 is a portion where the channel region is set, the film thickness of the p-type base region 6 is set so as to define a channel length while setting the impurity concentration configuring the inverted channel at the time of application of the gate voltage Vg. For that reason, the p-type base region 6 has, for example, a p-type impurity concentration of $3 \times 10^{17}$ cm$^{-3}$ and a thickness of 0.4 to 0.6 μm.

The film thickness of the non-doped layer 7 can be arbitrarily set, but if the film thickness is too thick, the on-resistance Ron becomes high. For that reason, the thickness is set to 0.05 to 0.2 μm. It is preferable that the non-doped layer 7 is basically free of impurities, but the carrier concentration may be as low as possible. In particular, when the non-doped layer 7 is successively formed after the formation of the p-type base region 6, the p-type impurity remaining in the atmosphere may be introduced or nitrogen present in the atmosphere may be introduced as the n-type impurity. Even in such a case, the impurity concentration may be as low as possible. In the case where it is assumed that an impurity of one conductivity type can be introduced, an impurity of the other conductivity type is intentionally introduced and both of the impurities are doped and mutually cancelled so that the carrier concentration may be lowered. For example, when only one of the p-type impurity and the n-type impurity is doped, the impurity concentration is set to $5.0 \times 10^{15}$ cm$^{-3}$ or less, and when both the impurities are doped, the carrier concentration is set to $5.0 \times 10^{15}$ cm$^{-3}$ or less while mutually canceling those impurities.

In the first source region 8a of the n-type source region 8, the film thickness and the n-type impurity concentration are set so as to restrict the on-resistance Ron from increasing while reducing the saturation current value even when the high drain voltage Vd is applied at the time of a load short-circuiting. For that reason, the first source region 8a has an n-type impurity concentration of, for example, $2.0 \times 10^{16}$ to $1.0 \times 10^{17}$ cm$^{-3}$ and a thickness of 0.2 μm or more.

The film thickness of the second source region 8b in the n-type source region 8 is set to a degree that the entire region of the second source region 8b does not disappear due to a chemical reaction with the source electrode 15 while the impurity concentration is kept to be brought in ohmic contact with the source electrode 15. As the n-type impurity concentration of the second source region 8b is higher, the ohmic contact is more easily performed. However, as in the present embodiment, the n-type source region 8 is epitaxially grown and then p-type impurities are ion-implanted to form the p-type coupling layer 10, and in that case, if the n-type impurity concentration of the n-type source region 8 is too high, the p-type coupling layer 10 cannot be set to a desired concentration. For that reason, in the present embodiment, the n-type impurity concentration of the second source region 8b is set to, for example, $1.0 \times 10^{18}$ to $5.0 \times 10^{19}$ cm$^{-3}$.

As described above, the source electrode 15 is made of multiple metals, and a portion of the source electrode 15 brought in ohmic contact with the second source regions 8b are made of Ni, for example. In this instance, the portion of the second source region 8b which is brought into contact with Ni becomes an ohmic contact by Ni silicidation, but the second source region 8b is eliminated by the amount silicided. Since the thickness of the Ni silicide produced by the silicidation reaction is about 0.1 μm, the thickness of the second source region 8b is set to 0.1 μm or more to prevent the second source region 8b from disappearing in the entire region by the silicidation reaction.

However, if the thickness of the first source region 8a and the second source region 8b is increased, the trench gate structures need to be formed deeper. For that reason, the film thickness of the first source region 8a is set to 0.5 μm or less, and the film thickness of the second source region 8b is set to 0.2 μm or less.

In addition, when the p-type base region 6, the non-doped layer 7, and the n-type source region 8 are formed by epitaxial growth, variations in film thickness of each portion can be reduced. In the p-type base region 6 used for forming the channel region, the channel length can be formed with high accuracy by reducing the film thickness variation. As a result, a variation in a threshold Vth of the vertical MOSFET can be reduced.

For example, the non-doped layer 7 and the n-type source region 8 can be also formed by epitaxially growing the p-type base region 6 and then implanting an n-type impurity into the p-type base region 6. However, in this case, the film thickness of the p-type base region 6 at the time of epitaxial growth needs to be increased in consideration of the film thickness of the non-doped layer 7 and the n-type source region 8 formed by ion implantation. The film thickness variation at the time of epitaxial growth becomes larger as the film thickness to be grown becomes thicker, but the variation in the range of ion implantation is not so large, so that the film thickness variation of the p-type base region 6 after ion implantation becomes a variation corresponding to the film thickness of the epitaxially grown film. For that reason, for example, if the film thickness variation of the p-type base region 6 is ±0.21 μm when the film thickness is 1.4 μm, the film thickness variation of the p-type base region 6 is ±0.21 μm even after the non-doped layer 7 and the n-type source region 8 are formed by ion implantation.

On the other hand, when each portion is formed by epitaxial growth as in the present embodiment, the film thickness variation of the p-type base region 6 does not become a variation including the film thicknesses of the non-doped layer 7 and the n-type source region 8, but becomes a variation corresponding to the film thickness of only the p-type base region 6. For example, when the film thickness of the p-type base region 6 is set to 0.4 to 0.6 μm, the film thickness variation is ±0.06 to 0.09 μm. For that reason, each portion is formed by epitaxial growth, thereby being capable of reducing the variation in the film thickness of the p-type base region 6, and being capable of providing the channel length with high accuracy.

In the case where each portion is formed continuously by epitaxial growth, it is preferable that impurity species and the impurity concentration do not change abruptly because a lattice constant depends on the impurity species and the impurity concentration. On the other hand, in the case where the n-type source region 8 is formed above the p-type base region 6 through the non-doped layer 7 as in the present embodiment, since the impurity species does not change from the p-type to the n-type immediately, the impurity species can be restricted from changing abruptly. Also, when the n-type source region 8 is formed, since the second source region 8b having a relatively high concentration is formed after the first source region 8a having a relatively low concentration has been formed, the impurity concentration can be restricted from abruptly changing.

This makes it possible to restrict crystal defects that occur when the impurity species or the impurity concentration changes abruptly.

Figure 10E:
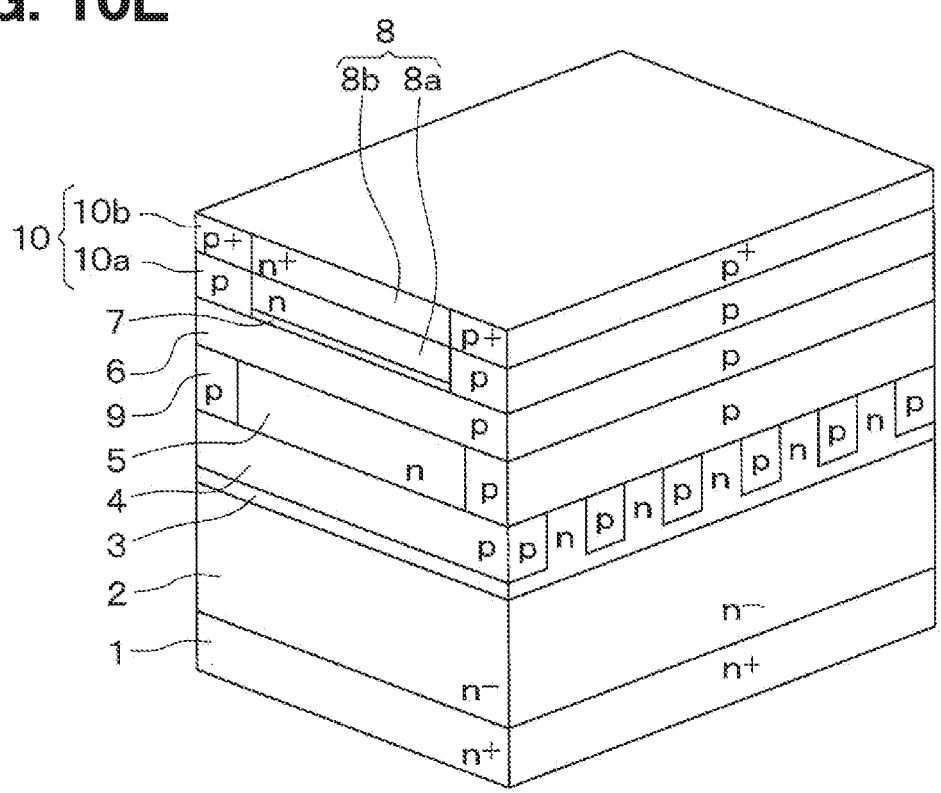
FIG. 10E is a perspective cross-sectional view showing a process of manufacturing the SiC semiconductor device subsequent to FIG. 10D.

[Process Shown in FIG. 10E]

A mask (not shown) is disposed on the n-type source region 8 so as to open a position where the p-type coupling layer 10 is to be formed. After ion implantation of the p-type impurity from above the mask, a thermal treatment at 1500° C. or more is performed for activation. As an element for ion implantation, one or both of boron (B) and aluminum (Al) are used. As a result, the n-type source region 8 can be subjected to ion implantation of the p-type impurity to form the p-type coupling layer 10. Since the p-type coupling layer 10 needs to be connected to the p-type base region 6, the p-type impurity is also implanted into the non-doped layer 7, and the implanted portion also becomes the p-type coupling layer 10.

At this time, the second region 10b of the p-type coupling layer 10 needs to be in ohmic contact with the source electrode 15. For that reason, ion implantation is performed at a dose amount of 2 to 10 times the n-type impurity concentration of the second source region 8b. It is considered that if the dose amount is twice as high as the n-type impurity concentration of the second source region 8b, the carrier concentration such that the ohmic contact with the source electrode 15 is performed can be obtained, but in view of the activation rate, the dose is preferably made to be 2 to 10 times as high as the n-type impurity concentration of the second source regions 8b.

As a result, the carrier concentration of the second region 10b, that is, the p-type impurity concentration of the portion functioning as a carrier excluding the portion canceled between the second source region 10b and the second source region 8b or the portion not activated can be, for example, $2.0 \times 10^{18}$ to $1.0 \times 10^{20}$ cm$^{-3}$. As the impurity concentration of the second region 10b is higher, the ohmic contact with the source electrode 15 becomes easier, but the second source region 8b prior to forming the second region 10b must also be brought into ohmic contact with the source electrode 15. In addition, if the dose amount is large, crystal defects are generated by ion implantation, so that the dose amount needs to be limited to a certain amount. In consideration of those factors, the n-type impurity concentration of the second source region 8b and the p-type impurity concentration of the second source region 10b need to be set. For that reason, the n-type impurity concentration of the second source region 8b and the p-type impurity concentration of the second source region 10b are set to, for example, $1.0 \times 10^{18}$ to $5.0 \times 10^{19}$ cm$^{-3}$.

On the other hand, since the first region 10a is not a portion brought in ohmic contact with the source electrode 15, the p-type impurity concentration may be lower than that of the second region 10b. In this example, the p-type impurity is ion-implanted at a dose amount of 2 to 10 times as high as the dose amount of the first source region 8a in consideration with the activation rate.

When the p-type coupling layer 10 is formed by ion implantation, from the viewpoint of an output of an ion implantation device, it is preferable that a total film thickness of the non-doped layer 7 into which the p-type impurity is implanted and the n-type source region 8 is 0.8 μm or less. With the above process, the p-type coupling layer 10 can be formed so as to reach the p-type base region 6 even at the output of a general-purpose ion implantation device, and the mass productivity can be ensured.

Figure 10F:
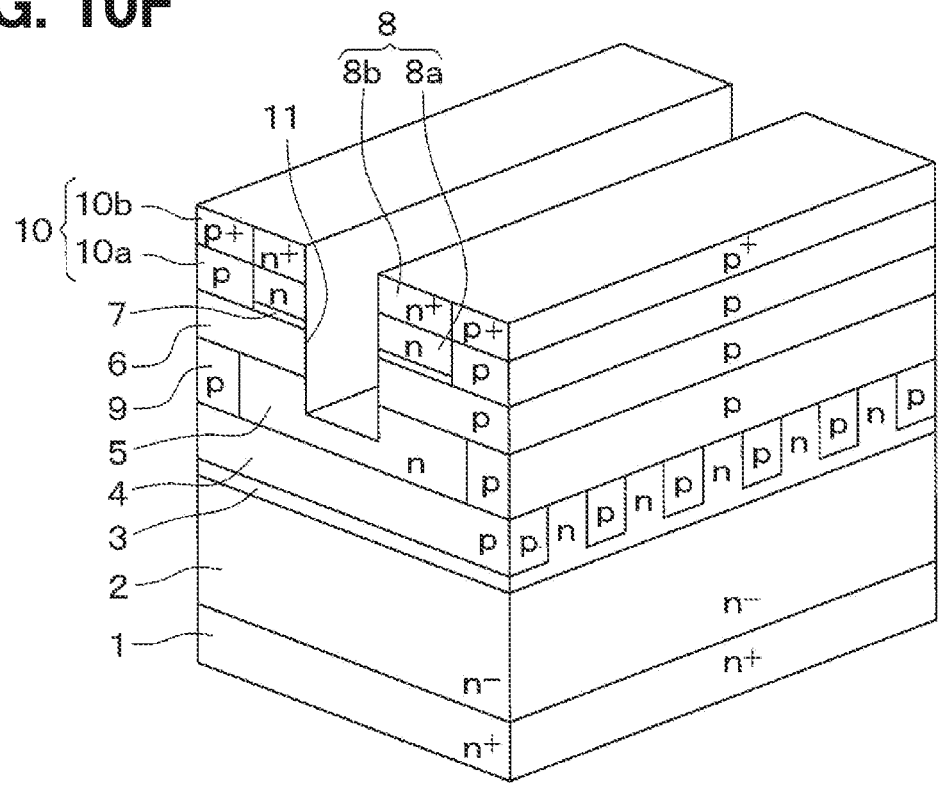
FIG. 10F is a perspective cross-sectional view showing a process of manufacturing the SiC semiconductor device subsequent to FIG. 10E.

[Process Shown in FIG. 10F]

After a mask (not shown) is formed on the n-type source region 8 or the like, a region of the mask where the gate trench 11 is to be formed is opened. Then, anisotropic etching such as RIE (Reactive Ion Etching) is performed with the use of the mask to form the gate trenches 11.

Figure 10G:
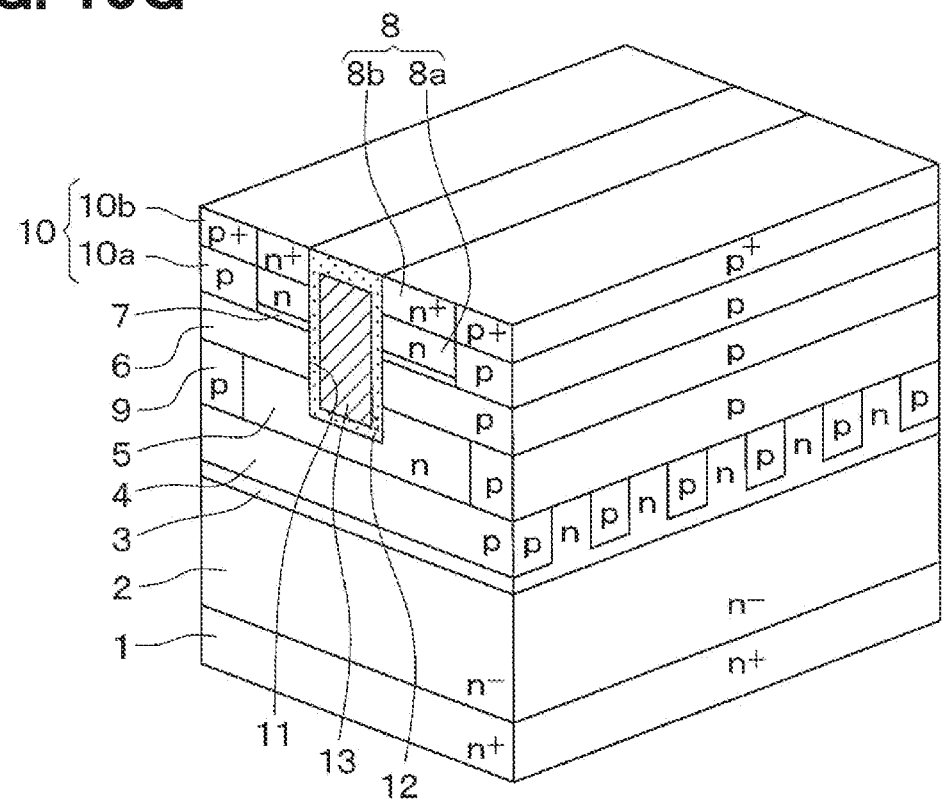
FIG. 10G is a perspective cross-sectional view showing a process of manufacturing the SiC semiconductor device subsequent to FIG. 10F.

[Process Shown in FIG. 10G]

Thereafter, after removing the mask, for example, thermal oxidation is performed to form the gate insulating film 12, and the gate insulating film 12 covers the inner wall surface of the gate trench 11 and the surface of the n-type source region 8. Then, a Poly-Si doped with a p-type impurity or an n-type impurity is deposited, and then etched back to leave at least the Poly-Si in the gate trench 11, thereby forming the gate electrode 13. As a result, the trench gate structure is completed.

Though not shown in the figure, the following processes are performed. In other words, the interlayer insulating film 14 made of, for example, an oxide film is formed so as to cover the surfaces of the gate electrode 13 and the gate insulating film 12. In addition, contact holes for exposing the n-type source region 8 and the p-type deep layer 9 are provided in the interlayer insulating film 14 with the use of a mask (not shown). Then, an electrode material of a multilayer structure of multiple metals, for example, is formed on the surface of the interlayer insulating film 14, and then the electrode material is patterned to form the source electrode 15 and the gate wire layer. Further, the drain electrode 16 is formed on the rear surface of the $n^+$-type substrate 1. In this manner, the SiC semiconductor device according to the present embodiment is completed.

As described above, in the SiC semiconductor device according to the present embodiment, the n-type source region 8 is configured by the first source region 8a having a relatively low concentration and the second source region 8b having a higher concentration than that of the first source region 8a. For that reason, the saturation current value at the time of the load short-circuiting can be reduced, and the short-circuit withstand capability of the SiC semiconductor device can be improved.

Further, in the SiC semiconductor device of the present embodiment, the non-doped layer 7 is provided between the p-type base region 6 and the first source region 8a. This makes it possible to restrict the generation of hot electrons and to restrict the damage to the gate insulating film 12.

Other Embodiments

Although the present disclosure has been described in accordance with the embodiments described above, the present disclosure is not limited to the embodiments described above, and encompasses various modifications and variations within the scope of equivalents. In addition, various combinations and configurations, as well as other combinations and configurations that include only one element, more, or less, are within the scope and spirit of the present disclosure.

(1) For example, in the above embodiments, the JFET portion 3 and the electric field blocking layer 4 are provided, and the n-type current dispersion layer 5 is provided, and the JFET portion 3 and the n-type current dispersion layer 5 configure a part of the drifting layer. However, the above configuration is merely an exemplary configuration of the vertical MOSFET, and a structure without the JFET portion 3 and the electric field blocking layer 4, a structure without the n-type current dispersion layer 5, or a structure without both of those components may be used.

(2) In the above embodiment, the case in which the p-type base region 6, the non-doped layer 7, and the n-type source region 8 are formed by epitaxial growth has been described, but the p-type base region 6, the non-doped layer 7, and the n-type source region 8 may be formed by other methods. For example, as compared with the above embodiments, the variation of the channel length can be increased, but the non-doped layer 7 and the n-type source region 8 may be formed by ion implantation of the n-type impurity into the p-type base region 6. Alternatively, the n-type source region 8 may be formed by adding the thickness of the n-type source region 8 onto the p-type base region 6 to epitaxially grow the non-doped layer 7, and ion-implanting an n-type impurity into the non-doped layer 7.

However, when the non-doped layer 7 and the n-type source region 8 are formed by ion implantation, a portion in which the side surface of the gate trench 11 is not perpendicular to the surface of the n-type source region 8 occurs. Specifically, when the gate trench 11 is formed, a defect on the inner wall surface is removed by performing sacrificial oxidation or chemical dry etching as necessary, but when there is ion implantation damage, the damaged portion is more easily removed than the portion not damaged. For that reason, the opening width is widened on the entrance side of the gate trench 11, and the side surface of the gate trench 11 is not perpendicular to the surface of the n-type source region 8. From this point of view, it is preferable to form the non-doped layer 7 and the n-type source region 8 by epitaxial growth.

(3) In addition, various dimensions such as the impurity concentration, thickness, width, and the like of each portion configuring the SiC semiconductor devices described in the above embodiment are shown by way of example only.

(4) In the above embodiments, the p-type deep layer 9 and the p-type coupling layer 10 are formed separately, but those layers may be formed of the same p-type layer. For example, a deep trench is formed from the surface of the n-type source region 8 through the non-doped layer 7, the p-type base region 6, and the n-type current dispersion layer 5 to reach the electric field blocking layer 4, and a p-type layer is formed so as to be buried in the deep trench. In this manner, the p-type deep layer 9 and the p-type coupling layer 10 can be formed by the p-type layer.

(5) In the above embodiments, the structure in which the n-type source region 8 is divided into two regions having different impurity concentrations, that is, the first source region 8a and the second source region 8b, has been described, but those regions may not be clearly divided. In other words, it is sufficient that the n-type source region 8 has a lower impurity concentration on a side close to the p-type base region 6 than on a surface side which is brought into contact with the source electrode 15, and the surface side has a higher impurity concentration which is brought into ohmic contact with the source electrode 15.

Figure 11:
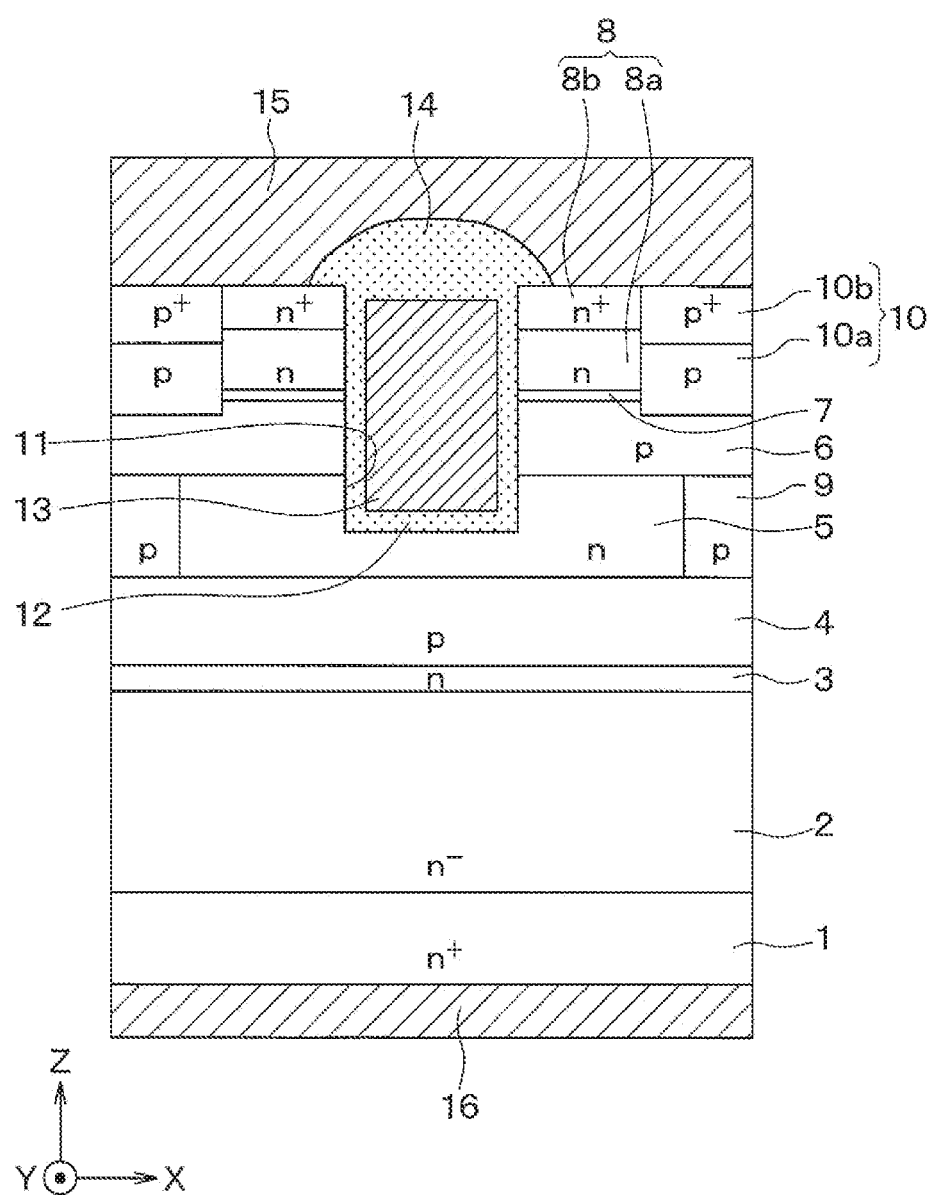
FIG. 11 is a cross-sectional view of a SiC semiconductor device according to another embodiment.

(6) In the above embodiments, the depth and the like of each impurity layer can be appropriately changed. For example, as shown in FIG. 11, the first region 10a may be formed to a position deeper than the first source region 8a, or the second region 10b may be formed to a position deeper than the second source region 8b and the non-doped layer 7.

(7) In the above embodiment, an n-channel type vertical MOSFET in which the first conductivity type is n-type and the second conductivity type is p-type is exemplified, but a p-channel type vertical MOSFET in which the conductivity types of the respective constituent elements are inverted may be used. In the above description, the vertical MOSFET is exemplified as the semiconductor device, but the present disclosure can be applied to an IGBT having a similar structure as that of the semiconductor device. In the case of the n-channel type IGBT, the conductivity type of the $n^+$-type substrate 1 is changed from the n-type substrate to the p-type substrate in each of the above embodiments, and the structures and manufacturing methods are the same as those in each of the above embodiments, except that the conductivity type of the $n^+$-type substrate 1 is changed from the n-type substrate to the p-type substrate.

What is claimed is:

1. A silicon carbide semiconductor device including an inverted semiconductor element, comprising:
    a substrate made of silicon carbide of a first or second conductivity type;
    a drift layer disposed above the substrate, made of silicon carbide of the first conductivity type, and having an impurity concentration lower than an impurity concentration of the substrate;
    a base region disposed above the drift layer, and made of silicon carbide of the second conductivity type;
    a source region disposed above the base region, made of silicon carbide of the first conductivity type, and having an impurity concentration higher than the impurity concentration of the drift layer;
    a plurality of trench gate structures aligned in stripes with one direction as a longitudinal direction, and each including a gate trench formed deeper than the base region from a surface of the source region, a gate insulating film covering an inner wall surface of the gate trench, and a gate electrode disposed on the gate insulating film;
    an interlayer insulating film covering the gate electrode and the gate insulating film and having a contact hole;
    a source electrode brought in ohmic contact with the source region through the contact hole;
    a drain electrode disposed to a rear surface of the substrate; and
    a non-doped layer having a carrier concentration of $5.0 \times 10^{15}$ cm$^{-3}$ or less, and provided between the base region and the source region, wherein
    the source region has a lower impurity concentration on a side close to the base region than on a surface side brought in ohmic contact with the source region.

2. The silicon carbide semiconductor device according to claim 1, wherein the source region includes a first source region located close to the base region and a second source region brought in ohmic contact with the source electrode.

3. The silicon carbide semiconductor device according to claim 2, wherein the second source region has a thickness of 0.1 μm or more and has a second conductivity type impurity concentration of $1.0 \times 10^{18}$ to $5.0 \times 10^{19}$ cm$^{-3}$.

4. The silicon carbide semiconductor device according to claim 2, wherein the first source region has a thickness of 0.2 to 0.5 μm and has an impurity concentration of $2.0 \times 10^{16}$ to $1.0 \times 10^{17}$ cm$^{-3}$.

5. The silicon carbide semiconductor device according to claim 1, wherein the non-doped layer has a thickness of 0.05 to 0.2 μm.

6. The silicon carbide semiconductor device according to claim 1, wherein a total film thickness of the non-doped layer and the source region is 0.8 μm or less.

* * * * *